United States Patent [19]

Settlemire et al.

[11] 4,342,120
[45] Jul. 27, 1982

[54] SQUELCH SYSTEM FOR USE IN A MULTIPLE CARRIER AM COMMUNICATIONS SYSTEMS RECEIVER

[75] Inventors: David J. Settlemire, Pompano Beach; John D. Ide, Margate; Mario C. Novo, Miami, all of Fla.

[73] Assignee: The Bendix Corporation, Southfield, Mich.

[21] Appl. No.: 205,395

[22] Filed: Nov. 10, 1980

[51] Int. Cl.³ .............................................. H04B 1/10
[52] U.S. Cl. ..................................... 455/222; 455/225
[58] Field of Search ................... 455/35, 203, 218–225

[56] References Cited

U.S. PATENT DOCUMENTS

| | | | |
|---|---|---|---|
| 3,100,871 | 8/1963 | Richardson et al. | 455/218 |
| 3,358,234 | 12/1967 | Stover | 455/203 |
| 3,626,294 | 12/1971 | Dancy | 455/222 |
| 3,939,425 | 2/1976 | Toyoshima | 455/222 |
| 4,020,421 | 4/1977 | Elder et al. | 455/225 |
| 4,093,824 | 6/1978 | Grosjean | 455/222 |

*Primary Examiner*—Jin F. Ng
*Attorney, Agent, or Firm*—W. G. Christoforo; Bruce L. Lamb

[57] ABSTRACT

A squelch system for use in a multicarrier communications receiver includes a conventional noise squelch circuit having a detector and filter operative to close a squelch gate in the absence of an incoming carrier and a phase locked loop means parallel thereto. The phase locked loop means does not lock onto noise signals but will lock onto carrier difference signals within its frequency range to open the squelch gate. A further improvement to the squelch system uses a threshold switch which parallels the above-mentioned conventional squelch circuit and phase locked loop means and comprised of a low pass filter and a comparator to maintain the squelch gate closed until the carrier portion of the receiver AM audio signal is above a certain threshold.

6 Claims, 2 Drawing Figures

SQUELCH SYSTEM FOR USE IN A MULTIPLE CARRIER AM COMMUNICATIONS SYSTEMS RECEIVER

BACKGROUND OF THE INVENTION

This invention relates to squelch circuits for communications systems and more particularly to squelch circuits used in multiple carrier communications systems.

In some communications systems, specifically those utilizing amplitude modulation, multiple carrier techniques are employed to provide extended range communications. One example of a communications system using multiple carrier techniques is the ARINC system which handles the exchange of operational information between an airplane flight crew and a ground station, normally in an airline office. The ARINC system is comprised of a network of mainly unattended ground based transceivers which transmit and receive VHF or line-of-sight carriers. The transceivers are arranged in linearly dispersed groups, all transceivers being effective to transmit or receive simultaneously. A message originating on the ground for an airborne aircraft is transmitted by the group of transceivers closest to the known position of the aircraft, a known calling technique being employed to excite only the receiver of the called aircraft. As might be suspected the called aircraft will usually hear simultaneous transmissions of the identical message from multiple transceivers. The constraints of the ARINC system require that each transceiver in a group transmit on a different frequency than other transceivers in the same group but these frequencies are closely spaced to one another. Thus, considering the closely spaced multiple carriers, a number of heterodyne frequencies are produced in the airborne receiver. More specifically, in the present ARINC system, in the carrier range of 118 MHz to 138 MHz, carrier offsets of 2.5, 4.0, 5.0, 7.5 and 8.0 kHz are encountered in practice. These produce difference frequencies in the airborne receiver AM detectors of 4.0, 5.0, 7.5, 8.0, 10.0, 12.0, 12.5, 15.0 and 16.0 kHz depending on the particular carrier environment in which the aircraft is operating, that is, the number of carriers that are impressed on a receiving antenna at one allocated channel frequency and their relative frequency offsets.

The difference frequencies produced in this multiple carrier environment render a conventional signal to noise squelch ineffective since this type of squelch cannot distinguish difference frequencies from normal Gaussian noise. For example, the conventional signal to noise squelch is comprised generally of the serial arrangement of a noise filter, noise detector, low pass filter and a comparator which controls a squelch gate. In the absence of an incoming carrier the noise filter input from the receiver AM detector is predominately noise. This noise is applied through the noise filter to the noise detector which in response thereto generates a noise signal which is applied through the low pass filter to the comparator. Here the noise signal is compared against a DC reference to close the squelch gate whenever the noise signal exceeds the reference. When a valid carrier and information signal are received, the receiver AGC action reduces the noise level from the receiver AM detector, thus reducing the noise signal to open the squelch gate. However, in a multiple carrier environment the resultant difference frequencies produced by a valid input signal generally fall within the band pass of the conventional squelch circuit noise filter and will produce a noise signal output from the noise detector to close the squelch gate. In that event, the airborne receiver will miss some communications or transmissions addressed to it.

Certain sophisticated squelch systems known in the prior art avoid the above mentioned problem, however, these are seldom used in practical receivers due to cost and complexity. Accordingly, the most common method of avoiding lost communications in current practice is a manual disabling of a conventional noise squelch on user command. This is obviously less than satisfactory since receiver noise will then be present as audio output. In addition, this manual scheme is undesirable as it requires a user operated control and necessary interface wiring to the receiver squelch circuits.

Other techniques rely on complex carrier recognition processes involving phase locked loops at intermediate (IF) or higher frequencies. These systems are complex, difficult to maintain and can be rendered ineffective in the presence of three or more carriers on an assigned channel.

Sharp narrow band noise filters which respond to valid information frequencies are impractical since normal transceiver frequency stability will insure that difference frequencies will be found essentially anywhere within a 4 to 16 kHz bandwidth.

SUMMARY OF THE INVENTION

The present invention overcomes the cost and complexity disadvantages of the above described squelch systems for multiple carrier communications systems by using low-cost tone-decoder phase locked loop integrated circuits to interrogate the noise band of a receiver AM detector output. If a difference frequency is located or identified the squelch gate is opened so that receiver audio output is enabled. More specifically, the present invention comprises a generally conventional prior art squelch circuit connected in parallel with phase locked loop means. The conventional prior art squelch circuit comprises a noise filter, noise detector and low pass filter serially connected with a comparator. As is standard, the receiver AM detector output, which is primarily noise in the absence of a carrier, is applied through the noise filter to the noise detector which in response thereto generates a noise signal. The noise signal is applied through the low pass filter to a comparator where it is compared to a DC reference voltage level. At the same time, the receiver AM detector output is applied to the phase locked loop means. In the event there is no carrier the conventional squelch circuit will generate a squelch signal in the conventional manner to close the squelch gate. In the event there are valid carriers present and a resulting difference frequency within the pass band of the noise filter, the conventional squelch signal will again, in this case, generate a squelch signal. However, at the same time, the phase locked loop means will lock onto the difference frequency to generate a signal which overcomes the squelch signal to open the squelch gate to permit the receiver audio to pass therethrough.

In another embodiment to be described below a threshold switch comprised of a low pass filter and comparator is connected to receive the receiver AM detector output and arranged to generate a squelch signal whenever the carrier portion of the receiver AM detector output is below a predetermined level. The output signals from the conventional squelch circuit, the phase locked loop means and the threshold switch are combined in a gating means to maintain the squelch gate closed until the carrier portion of the receiver AM detector output is at an acceptable level.

The object of the present invention is to provide a practical automatic squelch system for a multicarrier communications system.

DESCRIPTION OF THE PREFERRED EMBODIMENT

Figure 1:
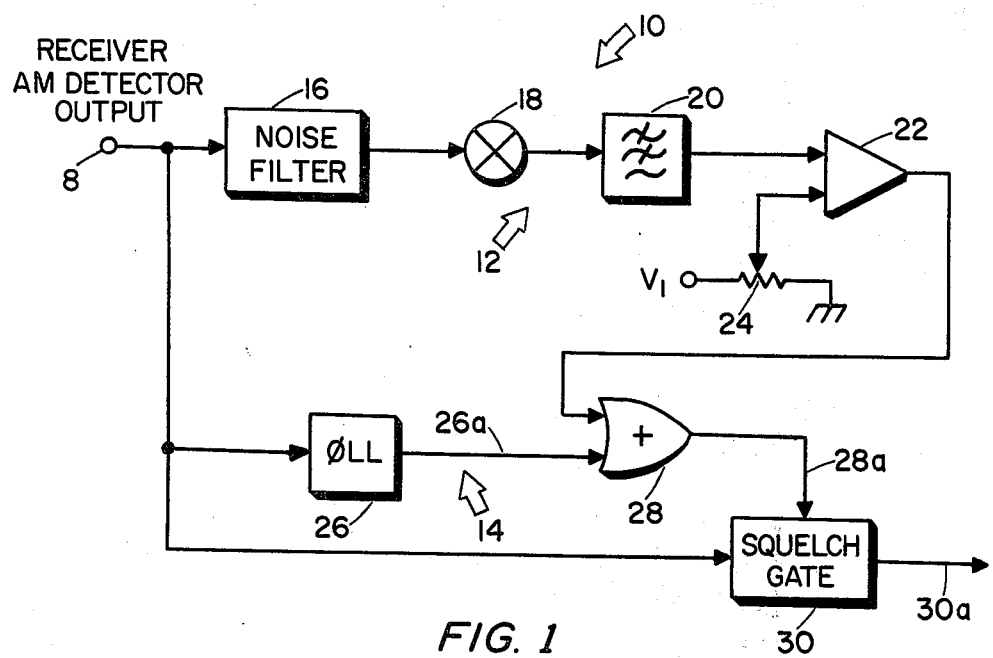
FIG. 1 is a block diagram of the preferred embodiment of the invention.

The preferred embodiment of the present squelch system 10, shown in FIG. 1, is comprised of a conventional prior art squelch circuit 12 connected in parallel with a phase locked loop circuit 14. The receiver AM detector output signal is applied through noise filter 16 to noise detector 18. Noise filter 16 is suitably a band pass type with a pass band of approximately 6 to 9 kHz for the present embodiment where this squelch system is used in an airborne receiver for the ARINC communications system. Since normal modulation frequencies are in the range of 350 to 2500 Hz they are not passed by noise filter 16. The output of noise detector 18 is applied to low pass filter 20 where the average, or alternately the peak value, of the noise is recovered, the output of low pass filter 20 being here termed the noise signal. The noise signal is compared in comparator 22 against a noise reference voltage level set by a voltage divider 24 connected across voltage source $V_1$. The output from comparator 22 is applied through OR gate 28 to control squelch gate 30 via line 28a. Squelch gate 30 is effective to interrupt or pass the receiver AM detector output signal at terminal 8 in response to the signal on line 28a. Thus, if low pass filter 20 generates a noise signal indicating that noise or difference frequencies in the pass band of noise filter 16 are present on terminal 8, comparator 22 will generate a first squelch signal which when applied through OR gate 28 will fail to open squelch gate 30 and thus fail to pass the signals at terminal 8 to line 30a at the output of the squelch gate. If the signals at terminal 8 comprise solely noise then this action is valid. However, if the signals at terminal 8 comprise difference frequencies in the 6 to 9 kHz band then this action is invalid and missed communications might result when squelch gate 30 fails to open. Phase locked loop circuit 14 is provided to cure the above problem. Circuit 14 is comprised of the phase locked loop 26 connected between terminal 8 and OR gate 28. Phase locked loop 26 preferably has a capture range which covers the pass band of noise filter 16. Thus, for the present embodiment wherein noise filter 16 has a pass band of 6 to 9 kHz a capture range for phase locked loop 26 of 5.5 to 9.5 kHz is practical. Since the receiver AM detector has a wider bandwidth than noise filter 16 and phase locked loop 26 is connected directly to receive the output of the receiver AM detector, the phase locked loop capture sensitivity can be matched to a 6 dB aural signal plus noise divided by noise $$\left(\frac{S+N}{N}\right)$$

ratio. Thus, if a difference frequency in the 5.5 to 9.5 kHz band is present on terminal 8, phase locked loop 26 will capture that frequency when at a 6 dB aural $$\frac{S+N}{N}$$

ratio on terminal 8.

The error signal for phase locked loop 26 is a second squelch signal taken at line 26a and applied through OR gate 28 to squelch gate 30 via line 28a. Upon capture of a difference frequency by phase locked loop 26 the error signal becomes such that when applied through OR gate 28 to squelch gate 30, the latter gate opens and connects line 30a to terminal 8. Line 30a is, of course, connected to a suitable transducer which converts the modulation at terminal 8 to a form intelligible to the aircraft crew members and instruments, as appropriate.

Although the circuit of FIG. 1 provides excellent squelch performance when used in the ARINC communications environment, there is a situation which theoretically could cause a problem. Specifically, in the event multiple difference frequencies in the 5.5 to 9.5 kHz capture range of the phase locked loop occur simultaneously the phase locked loop could fail to capture and missed communications could result if two of such difference frequency signals were of equal amplitude. However, it is extremely remote that multiple difference frequencies in the 5.5 to 9.5 frequency band would simultaneously occur and the possibility that if they do that two of them would be of equal amplitude is so remote as to make the probability essentially zero that the phase locked loop would fail to capture for these reasons. Thus, the system of FIG. 1 provides excellent squelch service and essentially guarantees that no missed communications will occur.

Figure 2:
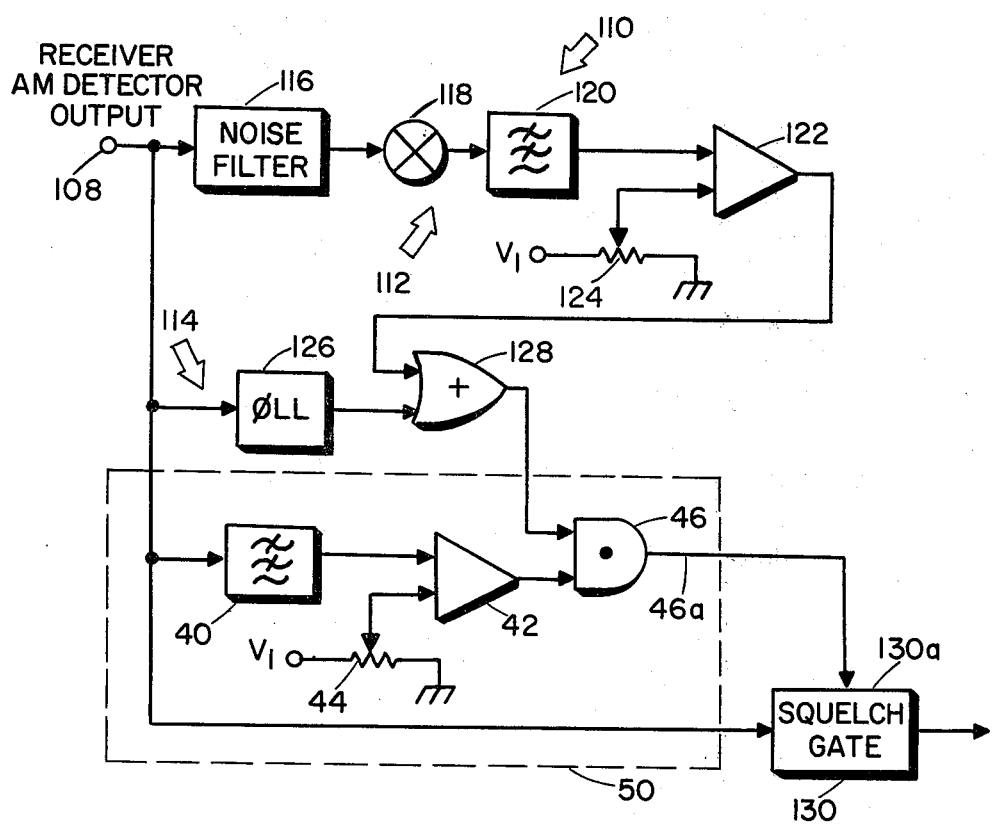
FIG. 2 is a block diagram of a variation of the invention.

Refer now to FIG. 2 which illustrates a further improvement. Certain elements of FIG. 2 are identical or similar to like elements of FIG. 1 and are accordingly denoted by the same numeral plus 100. The squelch system of FIG. 2 consists of a generally conventional squelch circuit 110, similar or identical to the generally conventional squelch circuit 10 of FIG. 1, and is comprised of noise filter 116, noise detector 118, low pass filter 120, comparator 122 and voltage divider 124 connected as a reference voltage across the $V_1$ voltage source. Squelch circuit 110 is paralleled by phase locked loop circuit 114 which is comprised of phase locked loop 126. Circuits 110 and 114 and the operation and functions thereof are similar to like circuits of FIG. 1 and need not be extensively described here again. Briefly, circuit 110 generates a relatively low level first squelch signal from comparator 122 when noise or difference frequencies in the band pass of noise filter 116 are present at terminal 108, otherwise a relatively high level output is generated. Circuit 114 generates a relatively high level signal only if a difference frequency in the capture range of phase locked loop 126 appears at terminal 108, otherwise a relatively low level signal is generated. The output signals from circuits 110 and 114 are combined in OR gate 128 and the resulting signal applied as one input to AND gate 46. Low pass filter 40, comparator 42 and voltage divider 44 which represents a reference for comparator 42, comprise a third circuit which generates a relatively high signal whenever a valid carrier appears on terminal 108, otherwise a relatively low output signal is generated. The elements within dash line box 50 including these latter elements plus AND gate 46, which receives the outputs from OR gate 128 and comparator 42, comprises a threshold switch which insures that squelch gate 130 remains closed until the carrier level has exceeded the threshold set by the value of the reference voltage level from voltage divider 44. Thus, the addition of threshold switch 50 to the sqelch system ensures that squelch gate 130 will be closed to interrupt communications from terminal 108 to line 130a until there is a valid carrier at terminal 108 at a satisfactory $$\frac{S+N}{N}$$

ratio.

In the squelch system actually built, a standard, commercially available solid state phase locked loop was used for block 26 of FIG. 1 and block 126 of FIG. 2 together with a number of passive elements external to the solid state device for setting the loop parameters. The solid state device is made by Exar Integrated Systems, Inc., P.O. Box 62229, Sunnyvale, CA 94088 and The Raytheon Corp., Semiconductor Division, 350 Ellis St., Mountain View CA 94042 and is designated as their part number XR2211. This device is ideally suited for the present embodiments in that pertinent loop parameters, as stated above, such as center frequency, capture range, tracking range and lock time can be easily adjusted to the particular application by selection of a small member of external passive elements as known to those familiar with this device. The device provides a logic output and its complement to indicate when the phase locked loop is locked. The system designer thus has a choice of loop output signals of either sense for comparator 42, thus providing flexibility in the choice of other circuit elements. Also as known to those skilled in the art, the $$\frac{S+N}{N}$$

ratio of lock-occurrence can be controlled by a simple change of input noise bandwidth so that capture or lock-occurrence will coincide with the desired aural $$\frac{S+N}{N}$$

ratio of the receiver.

As previously mentioned, it is important and desirable that the capture range of the phase locked loop encompass the pass band of the noise filter. In the present embodiment a single standard phase locked loop device was available to cover this frequency band. In some applications where the pass band of the noise filter is wider than the capture range of conveniently available phase locked loop devices, multiple phase locked loop devices might be used to cover the noise filter pass band, with the phase locked loop devices being connected in parallel and their outputs being connected together through an OR gate. This and other modifications and alterations of our invention should suggest themselves to those skilled in the art from a reading and study of the above description of the preferred embodiments of the invention. Accordingly, the invention is to be limited only by the true spirit and scope of the appended claims.

The invention claimed is:

1. A squelch system for use in a multiple carrier AM receiver having an output line and responsive to receiver detected AM signals comprising:

a noise squelch circuit operative in a first frequency band, which can include carrier difference frequencies, responsive to said receiver detected AM signals for generating a first squelch signal in the presence of noise and said carrier difference frequencies;

a phase locked loop means having a capture range encompassing said first frequency band and responsive to said receiver detected AM signals for generating a second squelch signal in the absence of said carrier difference frequencies; and, a squelch gate means responsive to said first and second squelch signals for passing said receiver detected AM signal to said output line when in a first state and for interrupting said receiver detected AM signals when in a second state.

2. The squelch system of claim 1 wherein said squelch gate means responds to said first and second squelch signals to pass said receiver detected AM signals in response to the occurrence of said first squelch signal and the simultaneous non-occurrence of said second squelch signal.

3. The squelch system of claim 1 or 2 wherein said phase locked loop means generates an error signal when unlocked, said second squelch signal corresponding to the error signal of said phase locked loop.

4. The squelch system of claim 3 wherein said noise squelch circuit includes a noise filter having a pass band of about 6 to 9 kHz and the capture range of said phase locked loop means is about 5.5 to 9.5 kHz.

5. The squelch system of claim 1 or 2 with additionally means responsive to said receiver detected AM signal for generating a third squelch signal when the carrier portion of said reciver detected AM signals is below a present threshold, said squelch gate means being responsive to said third squelch signal to interrupt said receiver detected AM signal.

6. The squelch system of claim 5 wherein said means for generating a third squelch signal comprises a voltage comparator, a DC voltage reference source connected as one input to said voltage comparator, and a low pass filter, said voltage comparator being connected to receive said receiver detected AM signals through said low pass filter as a second input, the output signal of said comparator comprising said third squelch signal.

* * * * *